(12) United States Patent
Nonaka et al.

(10) Patent No.: US 8,186,254 B2
(45) Date of Patent: May 29, 2012

(54) SHEET CUTTING DEVICE AND CUTTING METHOD

(75) Inventors: Hideaki Nonaka, Tokyo (JP); Kan Nakata, Tokyo (JP); Yoshiaki Sugishita, Tokyo (JP); Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 88 days.

(21) Appl. No.: 12/636,576

(22) Filed: Dec. 11, 2009

(65) Prior Publication Data

US 2010/0089216 A1 Apr. 15, 2010

Related U.S. Application Data

(62) Division of application No. 11/996,060, filed as application No. PCT/JP2006/314484 on Jul. 21, 2006, now abandoned.

(30) Foreign Application Priority Data

Aug. 4, 2005 (JP) ................................. 2005-226334
Jan. 25, 2006 (JP) ................................. 2006-015783

(51) Int. Cl.
*B26D 7/26* (2006.01)
(52) U.S. Cl. ............. 83/27; 83/887; 83/698.11; 901/28; 156/510
(58) Field of Classification Search ..................... 83/613, 83/43, 569, 884–887, 27, 28, 31, 36, 390, 83/745, 698.11, 922, 923; 901/27–29, 14–17, 901/40, 41; 30/310; 156/510
See application file for complete search history.

(56) References Cited

U.S. PATENT DOCUMENTS

| 4,068,156 A * | 1/1978 | Johnson et al. ................ 318/575 |
| 4,283,764 A * | 8/1981 | Crum et al. ............... 318/568.14 |
| 4,603,609 A * | 8/1986 | Takatoshi .......................... 82/51 |
| 5,016,489 A * | 5/1991 | Yoda .......................... 74/490.03 |
| 5,155,423 A * | 10/1992 | Karlen et al. ............ 318/568.11 |
| 7,516,768 B2 * | 4/2009 | Yamamoto et al. ........... 156/510 |

FOREIGN PATENT DOCUMENTS

| JP | 61-095812 A | 5/1986 |
| JP | 63-109997 A | 5/1988 |
| JP | 63-156691 A | 6/1988 |
| JP | 1-143393 | 6/1989 |
| JP | 04-336996 A | 11/1992 |

(Continued)

OTHER PUBLICATIONS

PCT/JP2006/314484 International Search Report.

*Primary Examiner* — Phong Nguyen
(74) *Attorney, Agent, or Firm* — Lowe Hauptman Ham & Berner LLP

(57) ABSTRACT

A cutting device that, after a sheet is stuck on a wafer on a sticking table, cuts the sheet along the outer edge of the wafer. The cutting device includes a robot body disposed besides the sticking table and a cutter blade supported by a tool holding chuck positioned at the front end of the robot body. The cutter blade is detachably attached to the tool holding chuck so as to be replaceable and is arranged so as to cut the sheet in a state that the posture thereof is adjusted along a preset movement track.

9 Claims, 7 Drawing Sheets

FOREIGN PATENT DOCUMENTS

| | | |
|---|---|---|
| JP | 08-090009 A | 4/1996 |
| JP | 09-201794 A | 8/1997 |
| JP | 10-180682 A | 7/1998 |
| JP | 11-003876 A | 1/1999 |
| JP | 2919938 B2 | 4/1999 |
| JP | 11-514618 A | 12/1999 |
| JP | 2002-255434 A | 9/2002 |
| JP | 2004-025438 A | 1/2004 |
| JP | 2005-123420 A | 5/2005 |
| JP | 2005-198806 A | 7/2005 |
| JP | 2007-019239 A | 1/2007 |

* cited by examiner

SHEET CUTTING DEVICE AND CUTTING METHOD

The present application is a divisional application of U.S. application Ser. No. 11/996,060 filed Jan. 17, 2008, which is based on, and claims priority from, International Application No. PCT/JP2006/314484, filed Jul. 21, 2006, Japan Application Number 2005-226334, filed Aug. 4, 2005 and Japan Application No. 2006-015783, filed Jan. 25, 2006, the disclosures of all of the above listed applications are hereby incorporated by reference herein in their entirety.

FIELD OF THE INVENTION

The present invention relates to a sheet cutting device and a cutting method, particularly to a sheet cutting device and a cutting method capable of cutting a sheet along a preset track and performing the cutting of the sheet with high precision.

BACKGROUND OF THE ART

Conventionally, semiconductor wafers (hereinafter, simply referred to as "wafer") are stuck with a protective sheet for protecting circuit surface thereof, and stuck with a heat sensitive adhesive sheet on the rear surface or front surface thereof.

As a sheet sticking method described above, the following methods are known. That is, using a raw strip sheet in which plane-shape sheets corresponding to the shape of the wafer are temporarily stuck on a release liner, the sheet is peeled off from the release liner with a peel plate, and then stuck onto the wafer; or using a raw strip sheet in which a strip of sheet is temporarily stuck on a strip of release liner, the sheet is peeled off from the release liner, stuck onto a wafer, and then cut off along the periphery of the wafer, thus the sheet is stuck onto the wafer (refer to, for example, patent document 1).

Patent document 1: Japanese Patent No. 2919938

SUMMARY OF THE INVENTION

Problem to be Solved by the Invention

However, in the method of sticking plane-shape sheets corresponding to the shape of the wafer, there is such a disadvantage that a precise sheet feed-out structure and a table shifting mechanism are indispensable for precisely matching the outer periphery of the wafer and the outer periphery of the sheet.

Also, the cutting device in the sticking apparatus disclosed in the patent document 1 is disposed immediately above the sticking table for supporting the wafer, and the sticking apparatus is arranged to be obliged to use such the cutting device, the rotation center of which is on a straight line running through the center of the wafer. Therefore, there is such a disadvantage that an extremely precise alignment between the rotation center of the cutting device and the rotation center of the wafer is required. Furthermore, the cutting direction is to be circumferential direction along the periphery of the wafer, and thereby the cutting device is not adapted to the cutting operation of other plane shapes, for example, the cutting in the direction along the outer periphery of a polygon shape; thus, resulting in a poor versatility as a cutting device.

Moreover, every alteration of the wafer size requires an adjustment of the cutter position, and since the cutter of the cutting device is kept in a constant posture, it is not possible to adjust the posture of a cutter blade corresponding to the thickness of the sheet or the sectional shape of the outer periphery of an adherend or the like. Even if the case where the posture can be adjusted, there still resides another disadvantage that a deviation of cutting diameter due to the alteration of the posture has to be adjusted again.

Still further, since the cutting device is positioned above the wafer, there is such a disadvantage as well that, when a failure occurs on the device, the cutter blade may accidentally touch a hand of a worker while carrying out removal operation of the wafer or maintenance operation, resulting in an injury.

Object of the Invention

The present invention has been proposed in view of the above disadvantages. It is an object of the present invention to provide a sheet cutting device and a cutting method capable of adjusting the posture of a cutter in cutting operation, and even when cutting position is changed accompanying the adjusting of the posture of the cutter, the cutting diameter can be maintained precisely to a preset value; moreover the cutting operation can be carried out without restriction of cutting shape.

Means for Solving Problems

In order to achieve the above object, the present invention adopts such an arrangement that a sheet cutting device to cut a sheet stuck on an adherend on a sticking table, comprising: a robot body and a cutter blade supported on a free-end of the robot body, wherein the robot body is a multi-joint robot having a plurality of joints and these joints are controlled based on numerical information.

Also, the present invention adopts such an arrangement that a sheet cutting device to cut a sheet stuck on an adherend on a sticking table, comprising: a robot body disposed beside the sticking table and a cutter blade supported on a free-end of the robot body and arranged so as to move along a preset track, wherein the robot body includes a tool holding chuck on the free-end side, and the cutter blade is detachably attached thereto via the tool holding chuck.

Further, the cutter blade may built-in a heater therein.

Furthermore, the cutter blade may be arranged so as to vibrate via a vibrating device.

Still further, such an arrangement is adopted that the robot body supports the cutter blade so as to adjust the posture of the cutter blade when cutting the sheet along the outer periphery of the adherend.

In the present invention, such an arrangement may be adopted that a posture of the cutter blade in the sheet cutting operation maintains a toe-in angle with which the center line of the cutter blade is inclined with respect to the cutting direction viewed from the top in the cutting direction, and a blade edge of the cutter blade is positioned closer to the outer periphery of the adherend than the back portion of the cutter blade.

Also, the posture of the cutter blade in the sheet cutting operation may be arranged so as to maintain a camber angle with which the center line of the cutter blade is inclined viewed from the front in the cutting direction, and the sheet can also be cut with no protrusion out of the outer periphery of the adherend.

Further, such an arrangement may be adopted that the posture of the cutter blade in the sheet cutting operation maintains a caster angle with which the center line of the cutter blade is inclined in the cutting direction viewed from the side in the cutting direction, and the angle formed between the sheet and the blade edge is kept at an acute angle.

Furthermore, such an arrangement is adopted that an inspection means for inspecting cutter blades is disposed in the vicinity of the robot body.

The present invention adopts such a sheet cutting method to cut a sheet stuck on an adherend on a sticking table that a multi-joint robot body is used, the robot having a plurality of joints controlled based on numerical information and holding a cutter blade on a free-end of the robot body in a state enabling to adjust a posture of the cutter blade, and the sheet is cut by movement of the cutter blade along a preset track.

Also, the present invention adopts such a sheet cutting method to cut a sheet stuck on an adherend on a sticking table, wherein a cutting device is used, a robot body of which is disposed beside the sticking table and holds a cutter blade on a free end thereof in a state enabling to adjust a posture of the cutter blade, and the cutting device includes a cutter blade and the sheet is cut by movement of the cutter blade along a preset track.

In the above cutting method, the sheet may be cut in a state that the cutter blade is heated.

Also, the cutter blade may also cut the sheet while being vibrated.

Further, such a method is adopted that the cutter blade maintains a toe-in angle with which the center line of the cutter blade is inclined with respect to the cutting direction viewed from the top in the cutting direction, and the sheet is cut in a state that a blade edge of the cutter blade is positioned closer to the outer periphery of the adherend than the back portion of the cutter blade.

Furthermore, such a method may also be adopted that the cutter blade maintains a camber angle with which the center line of the cutter blade is inclined viewed from the front in the cutting direction, and the sheet is cut with no protrusion out of the outer periphery of the adherend.

Still further, such a method may be adopted the cutter blade maintains a caster angle with which the center line of the cutter blade is inclined in the cutting direction viewed from the side in the cutting direction, and the sheet is cut while keeping the angle formed between the sheet and the blade edge at an acute angle.

It is possible to adopt such a method that the sheet is an adhesive sheet temporarily stuck on a strip of release liner as an adherend via an adhesive, and the adhesive sheet and adhesive are cut without cutting the release liner.

Further, such a method may be adopted that the sheet is an adhesive sheet temporarily stuck on a strip of release liner as an adherend via an adhesive, and a partial cutting is made to form a cutoff line without completely cutting the release liner and/or adhesive sheet.

Effect of the Invention

According to the present invention, since the robot body is controlled in a manner of NC (Numerical Control), the movement amount of the respective joints with respect to a workpiece is controlled based on the corresponding numerical information respectively, and each movement amount is controlled through a program. Therefore, being different from the conventional cutting means, the position of the cutter blade does not have to be changed manually whenever the wafer size is altered. Also, in the conventional cutting means, deviation of cutting diameter caused by the alteration of the posture of the cutter blade had to be adjusted every time of the alterations. The robot body of the present invention can maintain the cutting diameter precisely to a preset value no matter how the posture of the cutter blade is changed. Further, during non-cutting operation, since the cutter blade can be escaped to a position out of an area above the table; i.e., to an area beside the table, a wide workspace can be ensured above the sticking table, and such a risk can be reduced that a worker accidentally touches the cutter blade while removing an adherend from the sticking table manually or carrying out maintenance services.

Furthermore, since the cutter blade is detachably attached via the tool holding chuck, the cutter blade can be replaced easily and swiftly.

Still further, according to such an arrangement that the cutter blade incorporates the heater therein, the adhesive sheet can be cut more easily.

Still furthermore, owing to such an arrangement that the cutter blade cuts the adhesive sheet while vibrating via the vibrating device, the cutting performance can be enhanced.

Further, since the cutter blade is capable to adjust its posture by controlling the joints of the robot, the cutting angle can be altered corresponding to the stiffness and thickness of the sheet, the sectional configuration of the outer periphery of the adherend and the like; thus cutting operation can be achieved in accordance with the purpose.

For example, in a state that the cutter blade maintains the toe-in angle, cutting of the sheet just to fit to the outer periphery position of the adherend can be achieved.

Furthermore, in a state that the cutter blade maintains the camber angle, when the outer edge of the adherend is chamfered, the sheet can be cut with no protrusion out of the outer periphery of the adherend.

Still further, in such a state that the cutter blade maintains a caster angle, by inclining the blade end corresponding to the stiffness and thickness of the sheet, the sheet cutting force can be reduced.

Further, owing to such an arrangement that an inspection means of the cutter blade is disposed along with the cutting device, defects of the blade edge and adhering degree of adhesive of the sheet on the blade edge can be automatically detected. Owing to this, the cutter blade can be replaced with a new one, and thus, satisfactory cutting performance can be maintained stably.

EXPLANATION OF REFERENCE NUMERALS

Figure 1:
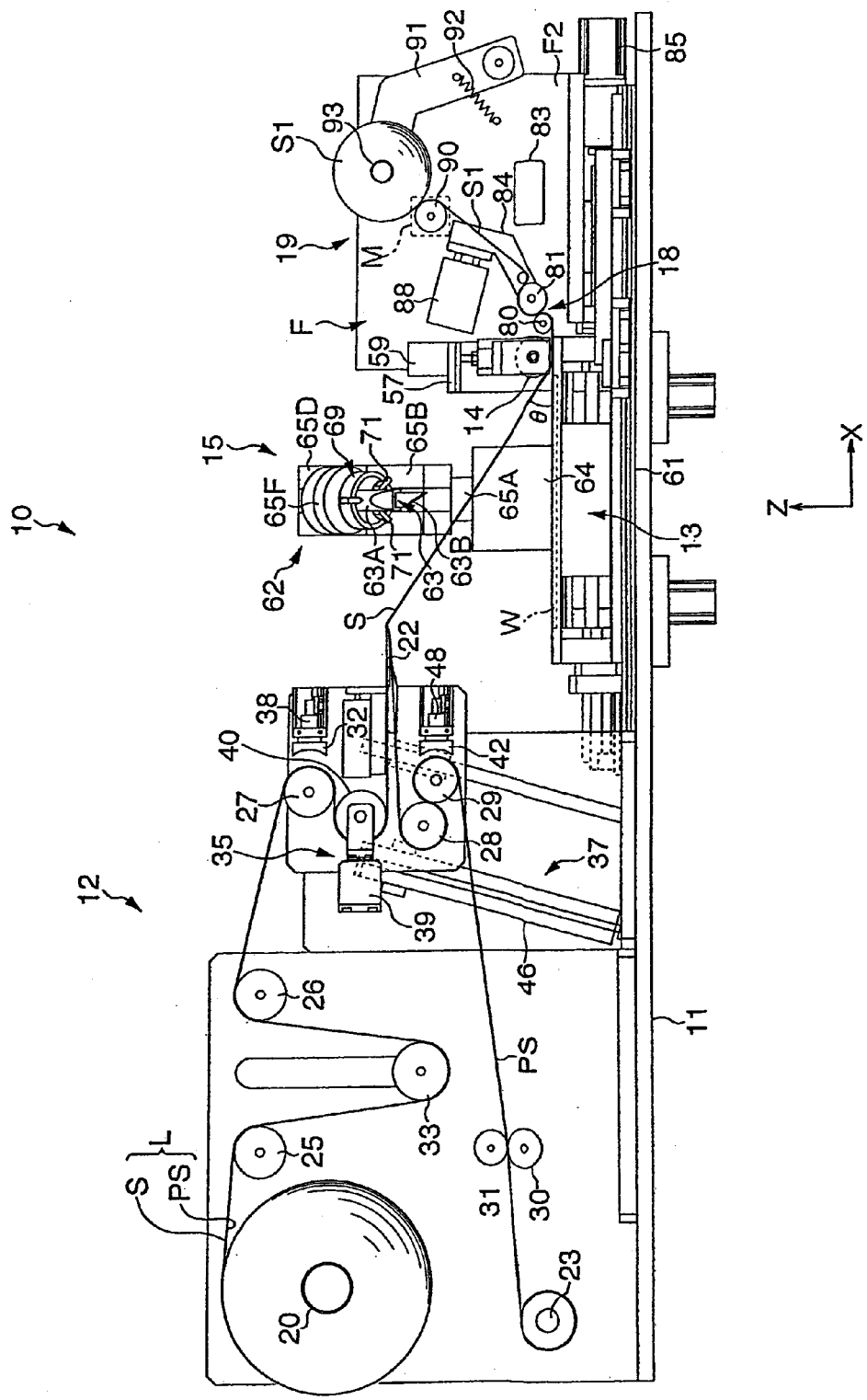
FIG. 1 is a front view schematically showing a sheet sticking apparatus in accordance with an embodiment.

10: sheet sticking apparatus
15: cutting device

16: inspection means
17: stock device
62: robot body
63: cutter blade
63A: blade holder
63B: blade
63D: blade edge
63E: back portion
63F: front end portion
63j: base portion
69: tool holding chuck
L: raw strip sheet
PS: release liner
S: adhesive sheet
S1: unnecessary adhesive sheet
W: wafer (adherend)

DESCRIPTION OF THE PREFERRED EMBODIMENTS

Hereinafter, embodiments of the invention will be described with reference to the drawings.

Figure 2:
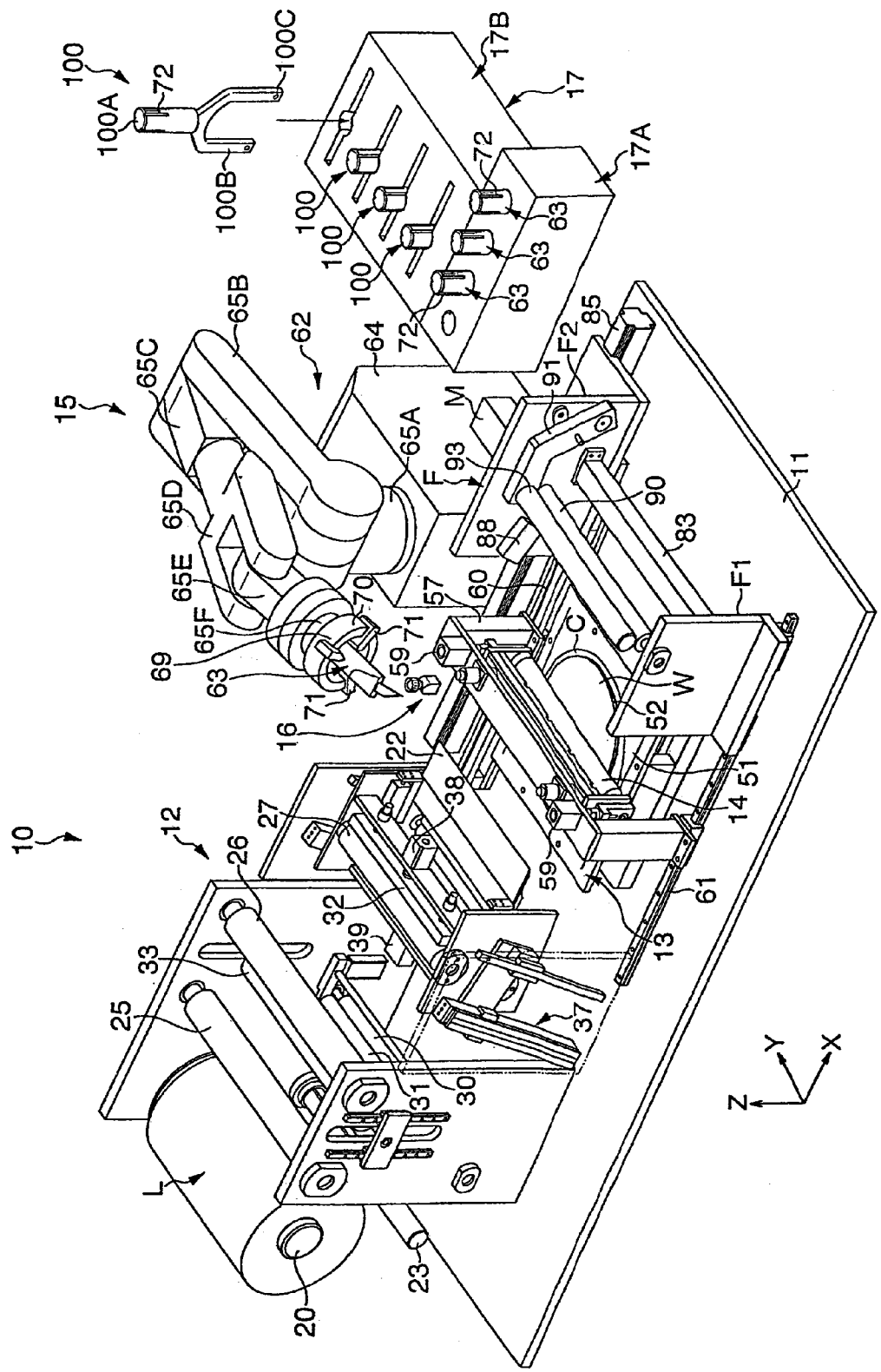
FIG. 2 is a perspective view schematically showing the sheet sticking apparatus.

FIG. 1 is a front view schematically showing a sheet sticking apparatus to which a cutting device according to the present invention is applied; and FIG. 2 is a schematic perspective view thereof. In these figures, a sheet sticking apparatus 10 comprises: a sheet feed-out unit 12 disposed in the upper portion of a base 11; a table 13 for supporting a wafer W as an adherend; a press roller 14 for imparting a press force to an adhesive sheet S fed out to the upper surface side of the wafer W to stick the adhesive sheet S to the wafer W; a cutting device 15 for cutting the adhesive sheet S along the outer edge of the wafer W after sticking the adhesive sheet S to the wafer W; an inspection means 16 (refer to FIG. 2) for inspecting a cutter blade 63 (which will be described later) of the cutting device 15; a stock device 17 for storing cutter blades 63 and the like; a peeling apparatus 18 for peeling off unnecessary adhesive sheet S1 outside the wafer W from the upper surface of the table 13; and a winding apparatus 19 for winding the unnecessary adhesive sheet S1.

The sheet feed-out unit 12 comprises: a support roller 20 for supporting a rolled raw strip sheet L in which a strip of adhesive sheet S is temporarily stuck on one surface of a strip of a release liner PS; a peel plate 22 with which the raw strip sheet L fed out from the support roller 20 is sharply folded back to peel off the adhesive sheet S from the release liner PS; a collection roller 23 for collecting the release liner PS by winding the same; a plurality of guide rollers 25 to 31 disposed between the support roller 20 and the collection roller 23; a buffer roller 33 disposed between the guide rollers 25 and 26; a tension measuring means 35 disposed between the guide rollers 27 and 28, which includes a load cell 39 and a tension measuring roller 40 supported by the load cell 39 and positioned at the base side of the peel plate 22; and a sticking-angle maintaining means 37 for integrally supporting the peel plate 22, guide rollers 27, 28, 29, and the tension measuring means 35, which interacts with the press roller 14 to maintain the sticking angle θ of the adhesive sheet S with respect to the wafer W to a constant angle. The guide rollers 27 and 29 are provided with brake shoes 32, 42 respectively. These brake shoes 32 and 42 are arranged so as, when sticking the adhesive sheet S to the wafer W, to be moved toward/away from the corresponding guide rollers 27, 29, by means of cylinders 38 and 48 respectively, to nip the adhesive sheet S to restrain the feeding thereof.

Note that the sheet feed-out unit 12, and the tension measuring means 35 and the sticking-angle maintaining means 37, which constitute the sheet feed-out unit, are the identical to those disclosed in the Japanese Patent Application Laid-Open No. 2005-198806 applied by the applicant of the present invention. Therefore, detailed description thereof will be omitted herein.

Figure 5:
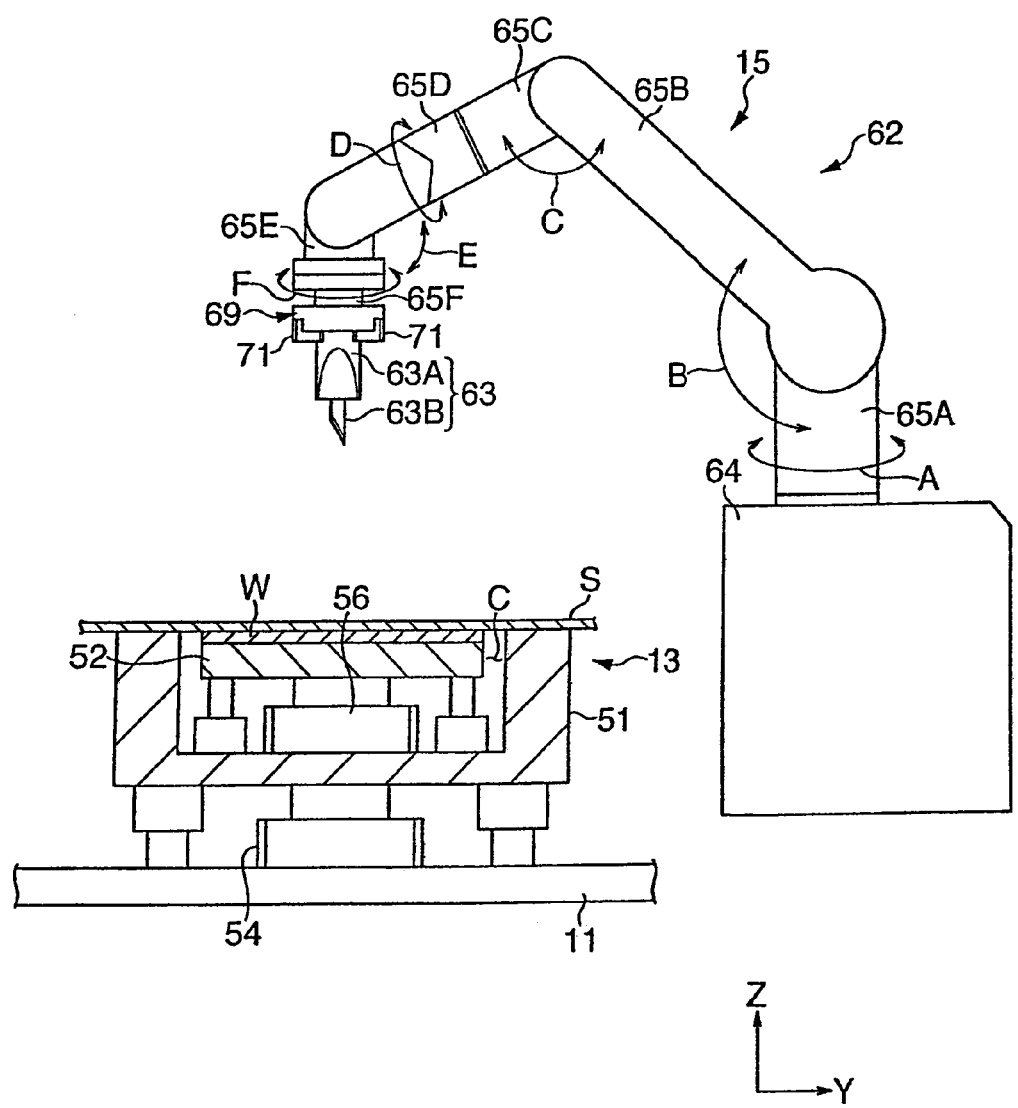
FIG. 5 is a partial cross sectional view of a table and the cutting device.

As shown in FIG. 5, the table 13 comprises: an outer table 51 having a substantially square shape in plane view; and an inner table 52 having a substantially circular shape in plane view. The outer table 51 is configured in a concave-shape so as to receive the inner table 52 in a state that a gap C is formed between the outer edge of the inner table 52 and the outer table 51, and is arranged so as to move in the vertical direction with respect to the base 11 via a uniaxial robot 54. On the other hand, the inner table 52 is arranged so as to move in the vertical direction with respect to the outer table 51 via a uniaxial robot 56. Accordingly, the outer table 51 and the inner table 52 are arranged so as to move integrally in the vertical direction as well as to move in the vertical direction independently each other. Owing to this, the outer table 51 and the inner table 52 are arranged to be adjustable to a predetermined level position corresponding to the thickness of the adhesive sheet S and the wafer W.

The press roller 14 is supported via a portal frame 57. On the upper surface side of the portal frame 57, cylinders 59, 59 are provided. The press roller 14 is arranged so as to move in the vertical direction owing to the operation of these cylinders 59. As shown in FIG. 2, the portal frame 57 is arranged to be movable in the X-direction in FIG. 1 via a uniaxial robot 60 and a guide rail 61.

Figure 3:
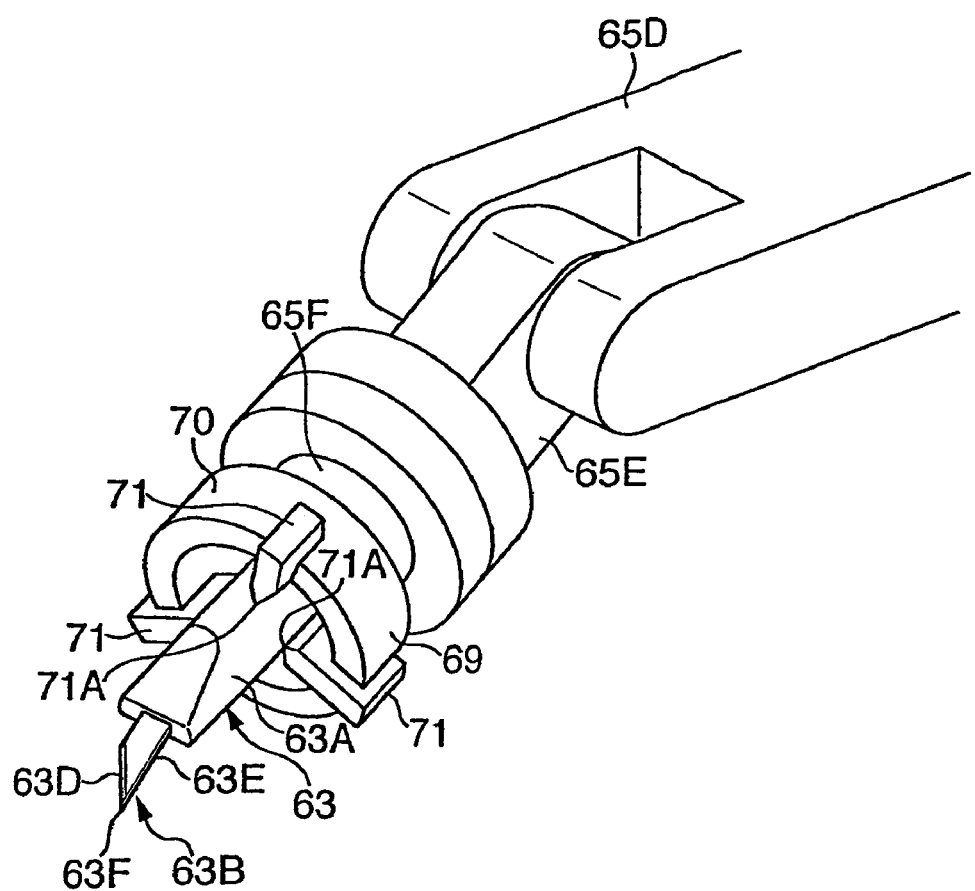
FIG. 3 is an enlarged perspective view showing a front-end portion of a cutting device.
Figure 4:
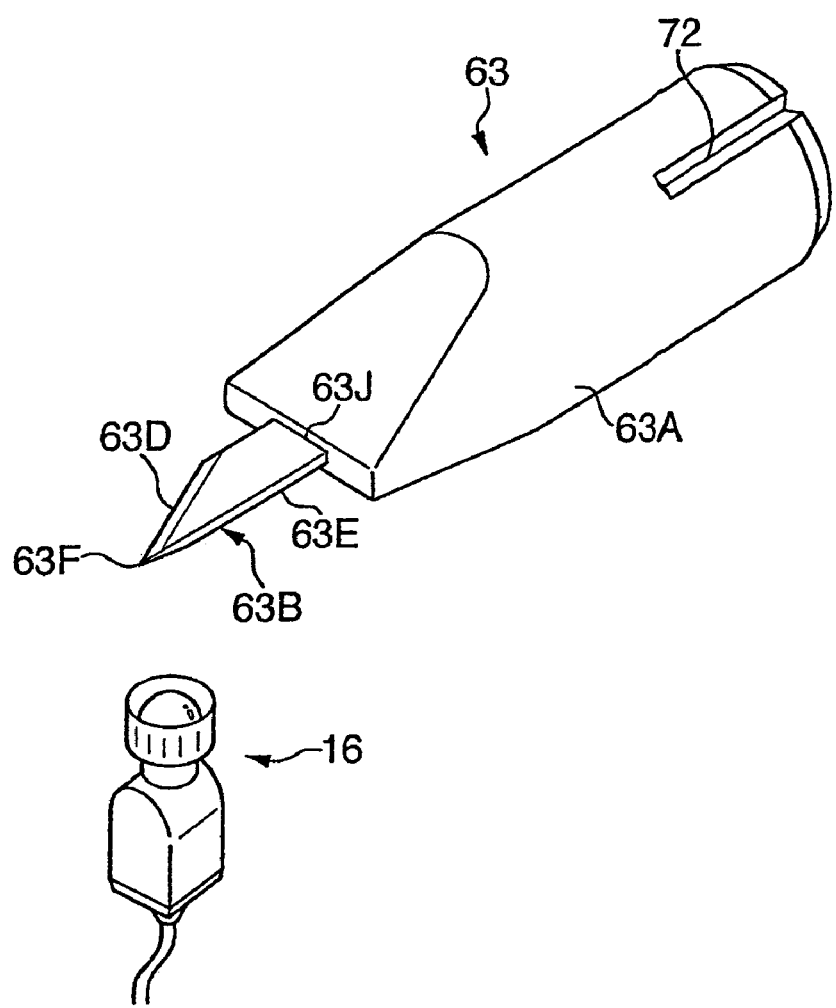
FIG. 4 is an enlarged perspective view of a cutter blade and an inspection means.

As shown in FIGS. 3 to 5, the cutting device 15 comprises a robot body 62 and a cutter blade 63 supported on the free-end side of the robot body 62. As shown in FIG. 5, the robot body 62 includes a base section 64, first to sixth arms 65A to 65F, which are disposed on the upper surface side of the base section 64 so as to be rotatable in the directions indicated with arrows A to F respectively, and a tool holding chuck 69 attached to the front end side of the sixth arm 65F; i.e., on the free-end side of the robot body 62. Each of the second, third and fifth arms 65B, 65C, 65E is provided rotatably within a Y×Z plane in FIG. 5; and each of the first, fourth and sixth arms 65A, 65D, 65F is provided rotatably about the axis thereof. The robot body 62 in this embodiment is controlled by NC (Numerical Control. That is, the movement amount of the respective joints with respect to a workpiece is controlled based on numerical information corresponding thereto, and every movement amount thereof is controlled through a program. Thus, the method adopted is completely different from the conventional cutting means, in which the position of cutter blade has to be changed manually whenever the wafer size is altered. Further, in the conventional cutting means, accompanying the alteration of the posture of the cutter blade (toe-in angle α1, camber angle α2, caster angle α3, which will be described later), deviation of cutting diameter has to be readjusted every time of the alteration. The robot body 62 of the embodiment can maintain the cutting diameter precisely to a preset value no matter how the posture of the cutter blade is altered. Furthermore, the cutter blade 63 is arranged so as to be moved to a position outside of the area above the table 13; i.e., a position beside the table 13 to escape therefrom during non-cutting operation.

As shown in FIG. 3, the tool holding chuck 69 comprises a cutter blade receiver 70 having a substantially cylindrical shape and three chuck claws 71 disposed at positions substantially 120° away from each other in the peripheral direction of the cutter blade receiver 70, which detachably holds the cutter blade 63 and a suction arm 100 to be described later. Each of the chuck claws 71 has a pointed-edge portion 71A, inner end of which forms an acute angle, and is arranged so as to move forward/backward in the radial direction with respect to the center of the cutter blade receiver 70 by pneumatic pressure.

As shown in FIG. 4, the cutter blade 63 comprises a blade holder 63A constituting a base portion and a blade 63B inserted into the front end of the blade holder 63A and fixed thereto. The blade holder 63A has a substantially cylindrical shape, and at the positions substantially 120° away from each other in the peripheral direction of the circumferential surface thereof, grooves 72 having a length extending from the base end to an intermediate portion thereof are formed along the axial direction. The pointed-edge portions 71A of the chuck claws 71 are arranged to engage with these grooves 72, and thereby the position of the cutter blade 63 with respect to the tool holding chuck 69 is maintained to be constant.

The blade holder 63A is equipped with a heater (not shown) and a vibrating device (not shown) therein, and is arranged so as to heat the blade 63B with the heater as well as to vibrate the blade 63B with the vibrating device. As the heater, a coil heater can be exemplified; and as the vibrating device, an ultrasonic vibrating device can be exemplified.

As shown in FIG. 2 and FIG. 4, the cutter blade inspection means 16 is arranged with a camera disposed along with the cutting device 15. The cutter blade inspection means 16 is for detecting defects of the blade edge 63D in the cutter blade 63 or adhered state of the adhesive on the blade edge 63D. It is arranged so that, when a defect is detected or when the amount of the adhesive adhered to the blade exceeds an allowable range, a signal is outputted to a control device (not shown); and corresponding to the signal, the robot body 62 automatically replaces the cutter blade 63 with another one stored in the stock device 17.

As shown in FIG. 2, the stock device 17 includes a first stocker 17A for storing each cutter blade 63 and a second stocker 17B for storing suction arms 100 to suck and hold the wafer W. In this embodiment, the cutting device 15 is arranged to be used as a transfer device as well; and thus has such a versatility is provided that, when a suction arm 100 is held in stead of the cutter blade, the wafer can be transferred. Note that the suction arm 100 comprises an arm holder 100A, which is formed with the same grooves 72 as those of the blade holder 63A, and a Y-shaped arm section 100B, which is attached to the arm holder 100A and has vacuum holes 100C communicating with a decompression device (not shown) in the front ends thereof. Other suction arms 100 are I-shaped arms having different shapes and arms for sucking different size wafers, and there is such an arrangement as suction arms for handling semiconductor wafers of 8 inch, 12 inch or the like can be stocked.

As shown in FIGS. 1 and 2, the peeling apparatus 18 comprises a small diameter roller 80 and a large diameter roller 81. A moving frame F supports the small diameter roller 80 and the large diameter roller 81. The moving frame F comprises a front frame F1 and a rear frame F2, relatively disposed along the Y-direction in FIG. 2, the rear frame F2 being coupled with the front frame F1 via a connecting member 83. The rear frame F2 is supported by a uniaxial robot 85, while the front frame F1 is supported by the guide rail 61. Owing to this, the moving frame F is movable in X-direction in FIG. 2. An arm member 84 supports the large diameter roller 81 as shown in FIG. 1. The arm member 84 is arranged so that a cylinder 88 can move the large diameter roller 81 in the direction closer to/away from the small diameter roller 80 by the cylinder 88.

The winding apparatus 19 comprises: a drive roller 90 supported by the moving frame F; and a winding roller 93, which is supported at the free-end of the rotation arm 91 and abutted on the circumferential surface of the drive roller 90 via a spring 92 to nip the unnecessary adhesive sheet S1. A drive motor M is disposed at the shaft end of the drive roller 90, and it is arranged so that, when the drive roller 90 is driven to rotate by the motor M, the winding roller follows the drive roller 90 to rotate; thereby the unnecessary adhesive sheet S1 is wound thereon. Note that as the wound amount increases, the winding roller 93 shifts rightward in FIG. 1 against the force of the spring 92.

Next, a cutting method of the adhesive sheet S in the embodiment will be described with reference to FIGS. 5 to 8. Note that the sticking method of the adhesive sheet S is the identical to that disclosed in the Japanese Patent Application Laid-Open No. 2005-198806. Therefore, description of the sheet sticking method will be omitted here.

Figure 6:
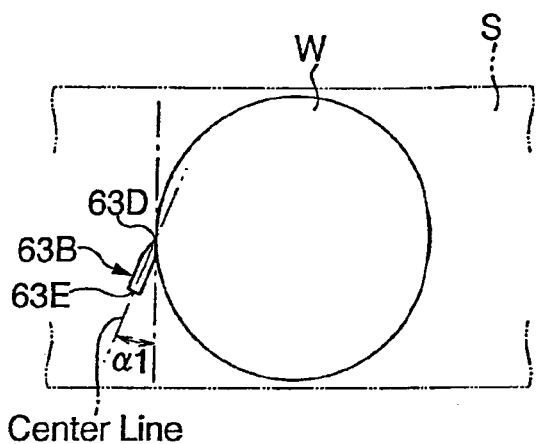
FIG. 6 is an explanatory view showing cutting operation of an adhesive sheet while keeping a toe-in angle.
Figure 7:
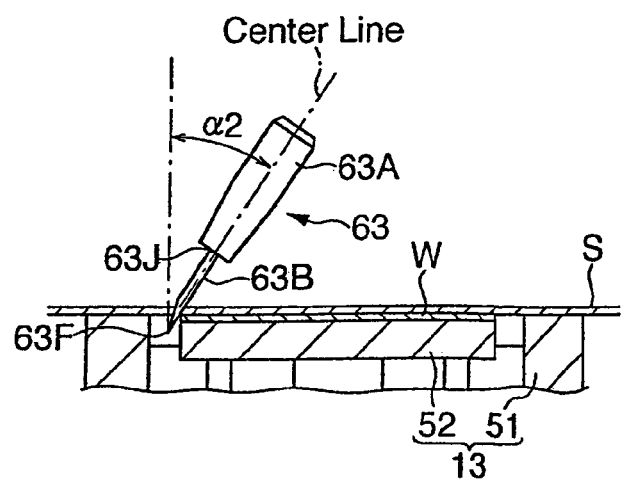
FIG. 7 is an explanatory view showing cutting operation of an adhesive sheet while keeping a camber angle.
Figure 8:
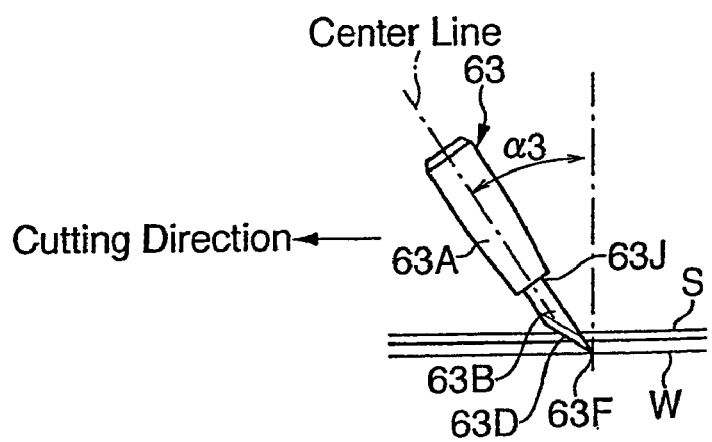
FIG. 8 is an explanatory view showing cutting operation of an adhesive sheet while keeping a caster angle.

As the initial settings, external dimensions of the wafer, a toe-in angle $\alpha 1$ with which the center line of the cutter blade 63 is inclined with respect to the cutting direction viewed from the top in the cutting direction as shown in FIG. 6, a camber angle $\alpha 2$ with which the center line of the cutter blade 63 is inclined viewed from the front side in the cutting direction as shown in FIG. 7, and a caster angle $\alpha 3$ with which the center line of the cutter blade 63 is inclined with respect to the cutting direction viewed from the side in the cutting direction as shown in FIG. 8 are inputted through an inputting device (not shown).

The above angles $\alpha 1$ to $\alpha 3$ will be described again in other words with reference to the modes shown in FIGS. 6 to 8. The toe-in angle $\alpha 1$ is an angle in a state that the blade edge 63D of the blade 63B is closer to the outer periphery of the wafer W than a back portion 63E; the camber angle $\alpha 2$ is an angle in a state that the front end portion 63F of the blade 63B is positioned at an outer side than the base portion 63J; and the caster angle $\alpha 3$ is an angle in a state that the base portion 63J of the blade 63B precedes the front end portion 63F in the cutting direction.

Note that, assuming the adhesive sheet S comes to the bottom surface side of the wafer W, and the adhesive sheet S is cut along the outer periphery of the wafer from the upper surface side, the camber angle is an angle in which the base portion 63J of the blade 63B is positioned at the outer side than the front end portion 63F. Also, as for the caster angle $\alpha 3$, the angle formed between the blade edge 63D and the adhesive sheet S has to be simply an acute angle. Accordingly, there may be such an inclined posture in which the base portion 63J is positioned behind the front end portion 63F in the cutting direction.

During the operation to stick the adhesive sheet S to the wafer W, the cutting device 15 is kept in a position where the cutter blade 63 escapes in a position beside the table 13. And after the adhesive sheet S is stuck onto the upper surface of the wafer W as shown in FIG. 5, the robot body 62 performs a predetermined operation so that the cutter blade 63 moves to a position above the table 13.

Then, based on the data inputted through the inputting device, movement track data stored in a storage of the control device (not shown) are read out, and the blade 63B cuts the adhesive sheet S along the outer shape of the wafer while maintaining the toe-in angle $\alpha 1$, camber angle $\alpha 2$ and caster angle $\alpha 3$ (refer to FIGS. 6 to 8). Here, when the sheet S can be hardly cut at a room temperature, the blade 63B may be heated by the coil heater, or may be vibrated by the ultrasonic vibrating device. Owing to this, the adhesive sheet S can be cut matching with the outer periphery of the wafer W in a state that the cutting resistance is reduced to an extremely small level.

Figure 9:
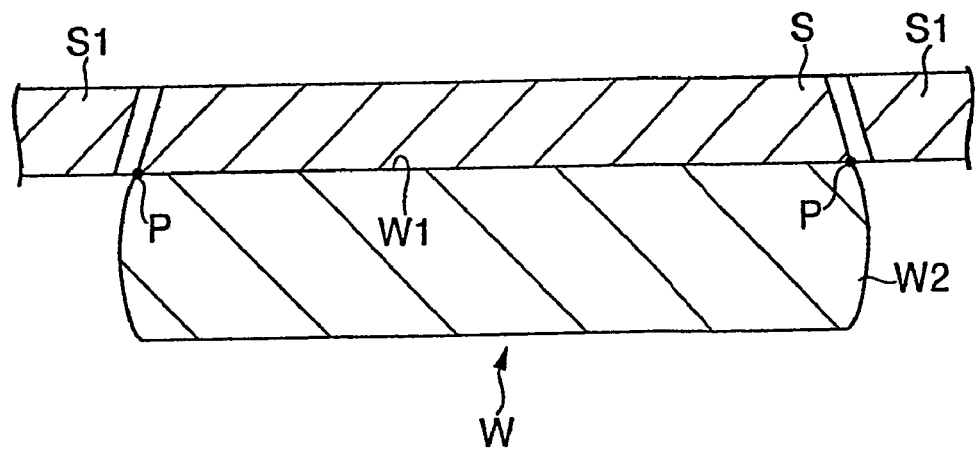
FIG. 9 is an enlarged cross sectional view showing a state of cut of the adhesive sheet stuck on a wafer.

Note that, since the sectional configuration of the periphery of the wafer W is chamfered as shown in FIG. 9, owing to the above-described toe-in angle α1 and camber angle α2, the adhesive sheet S can be cut close to an intersection P of the upper surface W1 and the side end surface W2 of the wafer W. Accordingly, outer periphery of the adhesive sheet S does not protrude out of the outer periphery of the wafer W. Therefore, when the wafer W stuck with the adhesive sheet S is subjected to grinding processing on the rear surface thereof in the following process, such a disadvantage can be prevented that a grinder catches a protruding portion of the sheet.

When the cutting operation of the adhesive sheet S is completed, in order to perform a temporary function as a transfer device, the cutting device 15 removes cutter blade 63B from the tool holding chuck 69, and replaces the same with the suction arm 100. At this time, the cutter blade 63B is subjected to an inspection of the blade edge 63D by the inspection means 16. Here, when damage or the amount of the adhesive adhered on the blade edge 63D exceeding an allowable range is detected, and when the cutter blade is determined as unacceptable, in the next cutting operation, the unacceptable cutter blade 63B is not used, and a signal is outputted to the control device (not shown) to replace the cutter blade 63B with a new one, and the unacceptable cutter blade 63B is stored in the stock device 17.

The cutting device 15 supporting the suction arm 100 sucks the wafer W after completion of cutting the adhesive sheet S, and transfers the same to the next process; and then transfers a next wafer W to be stuck with the adhesive sheet S from a wafer stocker (not shown) to the table 13. When the wafer W has been transferred, the cutting device 15 performs an operation to store the suction arm 100 to the second stocker 17B, and attaches a new cutter blade 63 to the tool holding chuck 69; thus to prepare for the next cutting operation.

When the wafers W are removed from the table 13 by the cutting device 15, which temporarily functions as the transfer device, the peeling device 16 winds the unnecessary adhesive sheet S1. Note that since the winding operation is the identical to the operation disclosed in the Japanese Patent Application Laid-Open No. 2005-198806, detailed description thereof will be omitted.

Therefore, according to the embodiment as described above, such effects can be obtained that the adhesive sheet S stuck on the wafer W can be precisely cut along the outer periphery of the wafer W, and adherends having various plane shapes can be handled as the sheet cutting objects.

The best arrangement and method for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, position and/or disposition without departing from the technical spirit and the range of the object of the present invention.

For example, in the embodiment, the case where the adhesive sheet S stuck on the wafer W is cut along the outer periphery of the wafer W has been described. However, the present invention is not limited to the above. Taking as a target an adhesive sheet temporarily stuck on a strip of release liner via an adhesive as an adherend, the adhesive sheet and the adhesive can be cut without cutting the release liner, or the release liner and/or adhesive sheet can be partially cut to form a cutoff line without cutting the same completely.

The invention claimed is:

1. A sheet cutting device for cutting a sheet stuck on an adherend on a sticking table, said device comprising:
a control device;
a robot body having a plurality of arm members rotatably connected with each other in series; and
a cutter blade directly supported by a last arm member of the arm members on a free-end of the robot body,
wherein said robot body supports said cutter blade so as to adjust a posture of the cutter blade when cutting the sheet along an outer periphery of said adherend,
wherein said control device is configured to actively control the robot body to hold said posture of said cutter blade in a sheet cutting operation for cutting said sheet in any cutting direction, on a surface of said adherend, to maintain
(i) a toe-in angle with which a center line of the cutter blade is inclined with respect to the cutting direction as viewed from the top in the cutting direction, and a blade edge of the cutter blade is positioned closer to the outer periphery of the adherend than a back portion of the cutter blade,
(ii) a camber angle with which the center line of the cutter blade is inclined as viewed from the front in the cutting direction, and a front end portion of the cutter blade is positioned at the outer side than a base portion of the cutter blade, and
(iii) a caster angle with which the center line of said cutter blade is inclined in the cutting direction as viewed from the side in the cutting direction, and an angle formed between said sheet and the blade edge is kept at an acute angle,
wherein
the entire robot body including all said arm members is rotatable about a first rotational axis of a first arm member of the arm members,
the first rotational axis is perpendicular to the sticking table on which the adherend is to be disposed, and
the first rotational axis is not coaxially arranged with respect to the sticking table and the adherend to be disposed thereon
wherein the plurality of arm members further comprises:
a second arm member which is rotatable about a second axis perpendicular to the first axis;
a third arm member which is rotatable about a third axis parallel to the second axis;
a fourth arm member which is rotatable about a fourth axis perpendicular to the third axis;
a fifth arm member which is rotatable about a fifth axis perpendicular to the fourth axis; and
the last arm member which is rotatable about a sixth axis perpendicular to the fifth axis; and
wherein said first to last arm members are continuously connected.

2. A sheet cutting device according to claim 1, wherein said robot body includes a tool holding chuck on a side of the free-end, and the cutter blade is detachably attached to the robot body via the tool holding chuck.

3. The sheet cutting device according to claim 2, further comprising
said control device having a memory to which movement track data of the cutter blade is stored, and
an input device configured for inputting an outer dimension of said adherend, said toe-in angle, said camber angle, and said caster angle,
wherein said control device is configured to read out the movement track data based on the data inputted through said input device and control the robot body to move said cutter blade to cut the sheet along the outer periphery of the adherend while maintaining the toe-in angle, the camber angle and the caster angle.

4. The sheet cutting device according to claim 1, wherein said robot body includes a tool holding chuck on a side of the free-end, and is configured for selectively holding the cutter blade and a suction arm for sucking and holding said adherend via the tool holding chuck.

5. The sheet cutting device according to claim 4, further comprising
said control device having a memory to which movement track data of the cutter blade is stored, and
an input device configured for inputting an outer dimension of said adherend, said toe-in angle, said camber angle, and said caster angle,
wherein said control device is configured to read out the movement track data based on the data inputted through said input device and control the robot body to move said cutter blade to cut the sheet along the outer periphery of the adherend while maintaining the toe-in angle, the camber angle and the caster angle.

6. The sheet cutting device according to claim 1, further comprising
said control device having a memory to which movement track data of the cutter blade is stored, and
an input device configured for inputting an outer dimension of said adherend, said toe-in angle, said camber angle, and said caster angle,
wherein said control device is configured to read out the movement track data based on the data inputted through said input device and control the robot body to move said cutter blade to cut the sheet along the outer periphery of the adherend while maintaining the toe-in angle, the camber angle and the caster angle.

7. The sheet cutting device according to claim 1, wherein the blade edge is inclined with respect to the center line of the cutter blade toward the cutting direction.

8. The sheet cutting device according to claim 1, wherein
said robot body includes a tool holding chuck that includes protruding members protruding inwardly for holding the cutter blade, and
said cutter blade includes grooves for receiving the protruding members of the tool holding chuck.

9. The sheet cutting device according to claim 8, further comprising a suction arm for sucking and holding said adherend,
wherein the suction arm includes grooves for receiving the protruding members of the tool holding chuck so that the cutter blade and the suction arm is selectively detachably attachable to the tool holding chuck.

\* \* \* \* \*